US012615811B2

(12) United States Patent
Sawa et al.

(10) Patent No.: US 12,615,811 B2
(45) Date of Patent: Apr. 28, 2026

(54) SEMICONDUCTOR DEVICE TO SUPPRESS LEAKAGE CURRENT

(71) Applicant: FUJI ELECTRIC CO., LTD., Kawasaki (JP)

(72) Inventors: Yuki Sawa, Matsumoto (JP); Motoyoshi Kubouchi, Matsumoto (JP); Takashi Yoshimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 530 days.

(21) Appl. No.: 18/145,027

(22) Filed: Dec. 22, 2022

(65) Prior Publication Data
US 2023/0261044 A1     Aug. 17, 2023

(30) Foreign Application Priority Data
Feb. 17, 2022     (JP) ................................. 2022-022659

(51) Int. Cl.
H10D 62/10          (2025.01)
H10D 12/00          (2025.01)
(Continued)

(52) U.S. Cl.
CPC ......... H10D 62/112 (2025.01); H10D 12/481 (2025.01); H10D 62/53 (2025.01); H10D 62/60 (2025.01); H10D 84/617 (2025.01)

(58) Field of Classification Search
CPC .... H10D 62/112; H10D 12/481; H10D 62/53; H10D 84/617; H10D 12/038;
(Continued)

(56) References Cited

U.S. PATENT DOCUMENTS

2007/0108558 A1     5/2007    Nemoto
2015/0357086 A1    12/2015    Boden
(Continued)

FOREIGN PATENT DOCUMENTS

EP          0862220 A1     9/1998
JP      H10242165 A     9/1998
(Continued)

OTHER PUBLICATIONS

Office Action issued for counterpart Japanese Application No. 2022-022659, transmitted from the Japanese Patent Office on Nov. 11, 2025.
(Continued)

*Primary Examiner* — Shahed Ahmed

(57)          ABSTRACT

Provided is a semiconductor device including: a buffer region having one or more doping concentration peaks having a higher doping concentration than a drift region; and a lifetime control portion provided at a position overlapping a shallowest concentration peak closest to a lower surface of a semiconductor substrate among the doping concentration peaks provided in the buffer region, and in which a carrier lifetime shows a local minimum value, in which the semiconductor substrate has a critical depth position at which an integrated value, which is obtained by integrating doping concentrations from an upper end of the drift region toward the lower surface, reaches a critical integrated concentration of the semiconductor substrate, and a depth position at which the carrier lifetime shows the local minimum value in the lifetime control portion is arranged closer to the lower surface than the critical depth position.

20 Claims, 14 Drawing Sheets

(51) Int. Cl.

| | | |
|---|---|---|
| *H10D 62/53* | (2025.01) |
| *H10D 62/60* | (2025.01) |
| *H10D 84/60* | (2025.01) |

(58) Field of Classification Search

CPC .. H10D 64/519; H10D 62/127; H10D 62/142; H10D 64/117; H10D 84/811; H10D 84/40–409; H10D 12/411–491; H10D 12/031–038; H10D 62/141–148; H10D 62/60–605

See application file for complete search history.

(56) References Cited

U.S. PATENT DOCUMENTS

| | | | |
|---|---|---|---|
| 2016/0254372 A1 | 9/2016 | Kawase | |
| 2016/0276470 A1 | 9/2016 | Gouda | |
| 2016/0284803 A1 | 9/2016 | Baburske | |
| 2017/0133482 A1 | 5/2017 | Shinsho | |
| 2017/0207330 A1 | 7/2017 | Enomoto | |
| 2017/0278929 A1 | 9/2017 | Imagawa | |
| 2018/0047725 A1 | 2/2018 | Yoshida | |
| 2018/0166279 A1 | 6/2018 | Tamura | |
| 2019/0287961 A1 | 9/2019 | Naito | |
| 2020/0365715 A1* | 11/2020 | Yoshida | H10D 84/811 |
| 2021/0043739 A1 | 2/2021 | Kato | |
| 2021/0043758 A1 | 2/2021 | Yokoyama | |
| 2022/0285537 A1* | 9/2022 | Nakamura | H10D 8/00 |

FOREIGN PATENT DOCUMENTS

| | | | |
|---|---|---|---|
| JP | 2005340465 A | 12/2005 |
| JP | 2007158320 A | 6/2007 |
| JP | 2015095534 A | 5/2015 |
| JP | 2015095559 A | 5/2015 |
| JP | 2016189465 A | 11/2016 |
| JP | 2017002283 A | 1/2017 |
| JP | 2017011001 A | 1/2017 |
| JP | 2017092283 A | 5/2017 |
| JP | 2017126724 A | 7/2017 |
| JP | 2018082191 A | 5/2018 |
| JP | 2019161168 A | 9/2019 |
| JP | 2020031222 A | 2/2020 |
| JP | 2020077883 A | 5/2020 |
| JP | 2021028930 A | 2/2021 |
| WO | 2015087439 A1 | 6/2015 |
| WO | 2016204126 A1 | 12/2016 |
| WO | 2017146148 A1 | 8/2017 |
| WO | 2020100995 A1 | 5/2020 |

OTHER PUBLICATIONS

Search Report by Registered Search Organization for counterpart Japanese Application No. 2022-022659. Published by the National Center for Industrial Property Information and Training on Oct. 9, 2025.

* cited by examiner

<u>400</u>

SEMICONDUCTOR DEVICE TO SUPPRESS LEAKAGE CURRENT

The contents of the following Japanese patent application(s) are incorporated herein by reference:

NO. 2022-022659 filed in JP on Feb. 17, 2022

BACKGROUND

1. Technical Field

The present invention relates to a semiconductor device.

2. Related Art

From the past, a configuration in which a semiconductor device such as an IGBT is provided with a buffer region such as a field stopper layer is known. Further, a technique of controlling a carrier lifetime by forming a defect in a semiconductor substrate is known (see, for example, Patent Documents 1 and 2).

Patent Document 1: Japanese Patent Application Publication No. 2017-126724

Patent Document 2: Japanese Patent Application Publication No. 2016-189465

DESCRIPTION OF EXEMPLARY EMBODIMENTS

Figure 1:
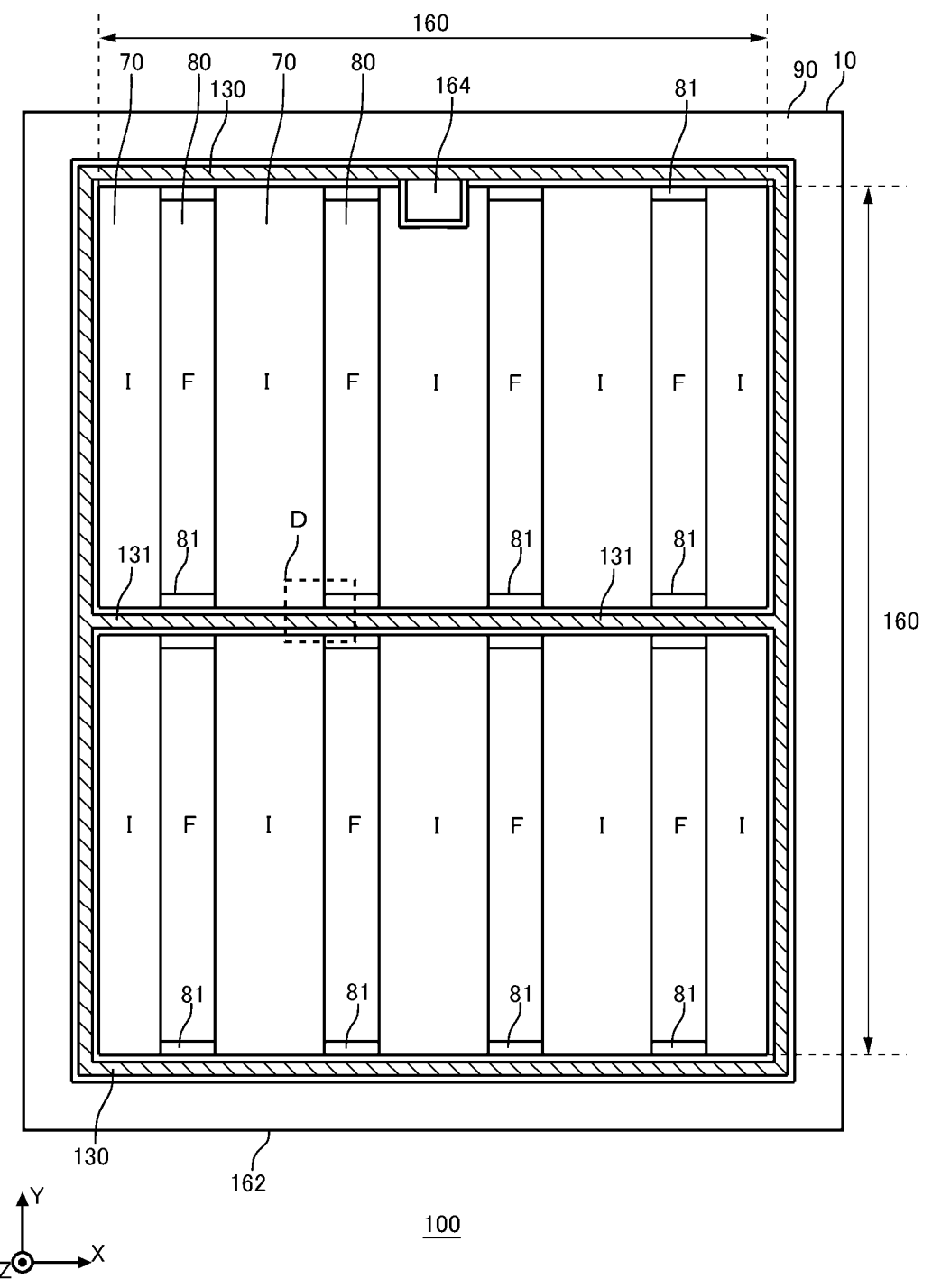
FIG. 1 is a top view showing an example of a semiconductor device 100 according to one embodiment of the present invention.

Hereinafter, the invention will be described through embodiments of the invention, but the following embodiments do not limit the invention according to claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer, or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

Further, the region from the center of the semiconductor substrate in the depth direction to the upper surface of the semiconductor substrate may be referred to as an upper surface side. Similarly, the region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is ND and the acceptor concentration is NA, the net doping concentration at any position is given as ND-NA. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, the N type bulk donor is distributed throughout the entire semiconductor substrate. The bulk donor is a dopant donor substantially uniformly contained in an ingot during the manufacture of the ingot from which the semiconductor substrate is made. The bulk donor of this example is an element other than hydrogen. The dopant of the bulk donor is, for example, phosphorus, antimony, arsenic, selenium, or sulfur, but the invention is not limited to these. The bulk donor of this example is phosphorus. The bulk donor is also contained in the P type region. The semiconductor substrate may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), and a float zone method (FZ method). The ingot in this example is manufactured by the MCZ method. An oxygen concentration contained in the substrate manufactured by the MCZ method is $1\times10^{17}$ to $7\times10^{17}/cm^3$. The oxygen concentration contained in the substrate manufactured by the FZ method is $1\times10^{15}$ to $5\times10^{16}/cm^3$. The hydrogen donor tends to be generated more easily with a higher oxygen concentration. The bulk donor concentration may use a chemical concentration of bulk donors distributed throughout the entire semiconductor substrate, and may be a value between 90% and 100% of the chemical concentration. Further, as the semiconductor substrate, a non-doped substrate not containing a dopant such as phosphorus may be used. In such a case, the bulk donor concentration (DO) of the non-doped substrate is, for example, $1\times10^{10}/cm^3$ or more and $5\times10^{12}/cm^3$ or less. The bulk donor concentration (DO) of the non-doped substrate is preferably $1\times10^{11}/cm^3$ or more. The bulk donor concentration (DO) of the non-doped substrate is preferably $5\times10^{12}/cm^3$ or less. Note that each concentration in the present invention may be a value at room temperature. By way of example, a value at 300K (Kelvin) (about 26.9° C.) may be used as the value at room temperature.

In the present specification, a description of a P+ type or an N+ type means a higher doping concentration than that of the P type or the N type, and a description of a P– type or an N– type means a lower doping concentration than that of the P type or the N type. Further, in the present specification, a description of a P++ type or an N++ type means a higher doping concentration than that of the P+ type or the N+ type. The unit system in the present specification is an SI unit system unless otherwise specified. Although a unit of length is represented using cm, it may be converted to meters (m) before calculations.

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor, or net doping is substantially uniform in a region, or the like, an average value of the concentration of the donor, acceptor, or net doping in the region may be set as the concentration of the donor, acceptor, or net doping. In the present specification, atoms/cm³ or/cm³ is used to indicate a concentration per unit volume. This unit is used for the donor or acceptor concentration, or the chemical concentration in the semiconductor substrate. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a top view showing an example of the semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1. The active portion 160 may refer to a region that overlaps with the emitter electrode in the top view. Further, a region sandwiched by the active portion 160 in the top view may also be included in the active portion 160.

The active portion 160 is provided with a transistor portion 70 including a transistor element such as an IGBT (Insulated Gate Bipolar Transistor). The active portion 160 may further be provided with a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. The semiconductor device 100 of this example is a reverse-conducting IGBT (RC-IGBT).

In FIG. 1, a region where each of the transistor portions 70 is arranged is indicated by a symbol "T", and a region where each of the diode portions 80 is arranged is indicated by a symbol F. In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction.

The extending direction of the transistor portion 70 and the diode portion 80, and the longitudinal direction of each trench portion described later may be the same.

Each of the diode portions 80 includes a cathode region of an N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of a P+ type may be provided in a region other than the cathode region. In the present specification, the diode portion 80 may also include an extension region 81 where the diode portion 80 extends to a gate runner described later in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 164. The semiconductor device 100 may have a pad such as an anode pad, a cathode pad, and a current detection pad. Each pad is arranged in a region close to the end side 162. The region close to the end side 162 refers to a region between the end side 162 and the emitter electrode in the top view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner that connects the gate pad 164 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. Further, a well region is formed below the gate runner. The well region is a P type region having a higher concentration than the base region described below, and is formed to a position deeper than the base region from the upper surface of the semiconductor substrate 10. In the top view, the region enclosed by the well region may be the active portion 160.

The outer circumferential gate runner 130 is connected to the gate pad 164. The outer circumferential gate runner 130 is arranged above the semiconductor substrate 10. The outer circumferential gate runner 130 may be a metal wiring including aluminum.

The active-side gate runner 131 is provided in the active portion 160. Providing the active-side gate runner 131 in the active portion 160 can reduce a variation in wiring length from the gate pad 164 for each region of the semiconductor substrate 10.

The outer circumferential gate runner 130 and the active-side gate runner 131 are connected to the gate trench portion of the active portion 160. The outer circumferential gate runner 130 and the active-side gate runner 131 are arranged above the semiconductor substrate 10. The outer circumferential gate runner 130 and the active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction from one outer circumferential gate runner 130 to the other outer circumferential gate runner 130 sandwiching the active portion 160, so as to cross the active portion 160 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 2:
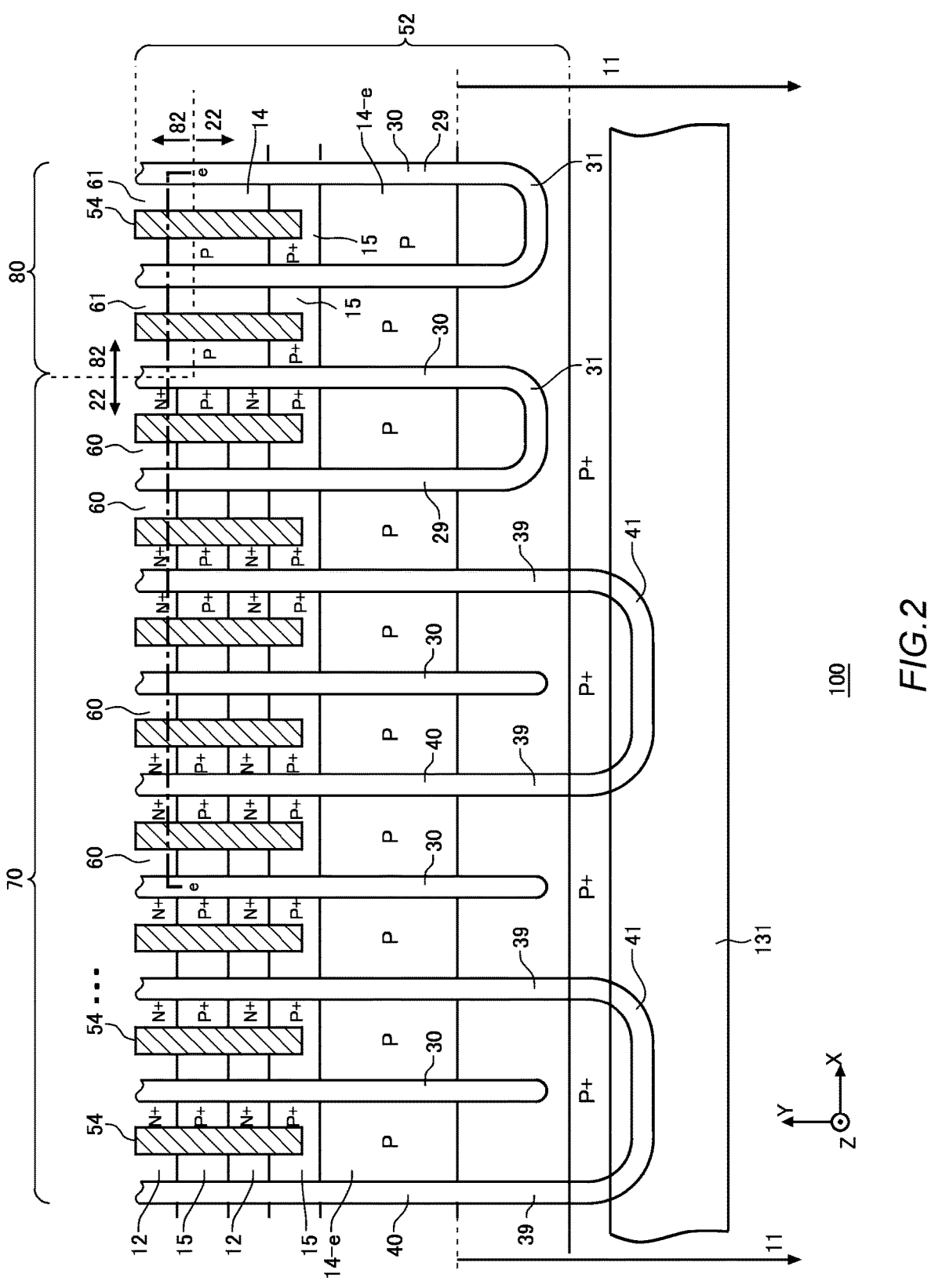
FIG. 2 is an enlarged view of a region D in FIG. 1.

FIG. 2 illustrates an enlarged view of a region D in FIG. 1. The region D is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation from each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction. The dummy conductive portion of the dummy trench portion 30 does not need to be connected to the emitter electrode 52 and the gate conductive portion, and may be controlled to be set at a potential different from the potential of the emitter electrode 52 and the potential of the gate conductive portion.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including metal. FIG. 2 shows a range where the emitter electrode 52 is provided. For example, at least a part of a region of the emitter electrode 52 is formed of aluminum or an aluminum-silicon alloy, for example, a metal alloy such as AlSi and AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is desirably provided in a curved-surface shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions of the gate trench portion 40 and the dummy trench portion 30 in the Y axis direction are provided in the well region 11 in a top view. In other words, the bottom portion of each trench portion in the depth direction is covered with the well region 11 at the end portion of each trench portion in the Y axis direction. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 2 shows the base region 14-e arranged at one end portion of each mesa portion in the extending direction, the base region 14-e is also arranged at the other end portion of each mesa portion. Each mesa portion may be provided with at least one of the emitter region 12 of the first conductivity type and the contact region 15 of the second conductivity type in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-*e* on the upper surface of the mesa portion 61, the contact region 15 may be provided in contact with each base region 14-*e*. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-*e*. The contact hole 54 of this example is provided above respective regions of the contact region 15, the base region 14, and the emitter region 12. The contact hole 54 is not provided in regions corresponding to the base region 14-*e* and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region 22 of the P+ type may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged separately from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion of the cathode region 82 of this example in the Y axis direction is arranged farther away from the well region 11 than the end portion of the contact hole 54 in the Y axis direction. In another example, the end portion of the cathode region 82 in the Y axis direction may be arranged between the well region 11 and the contact hole 54.

Figure 3:
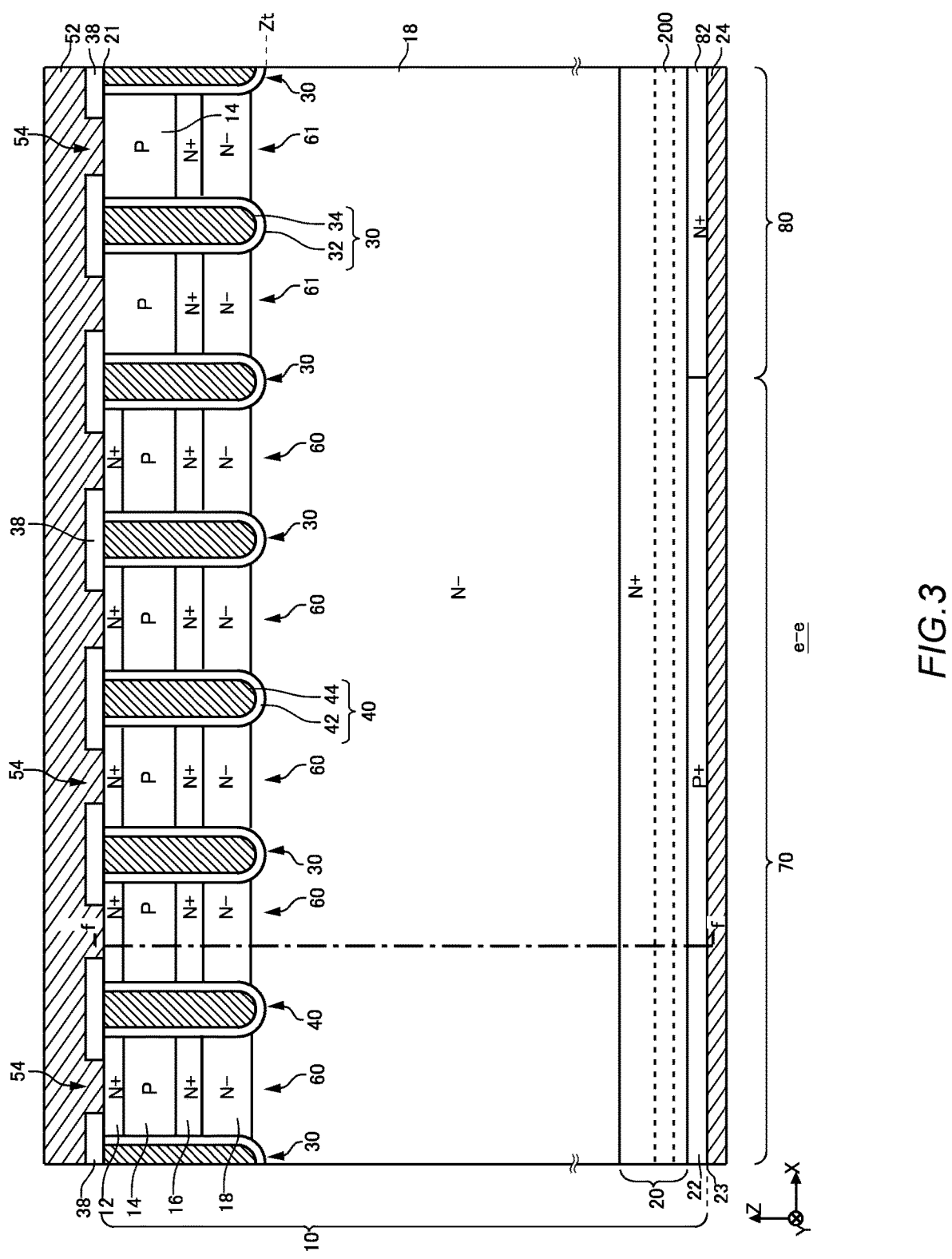
FIG. 3 illustrates an example of a cross section e-e in FIG. 2.

FIG. 3 illustrates a view showing an example of a cross section e-e in FIG. 2. The cross section e-e is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorus is added, a thermal oxide film, and other dielectric films. The interlayer dielectric film 38 is provided with the contact hole 54 described in FIG. 2.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

The semiconductor substrate 10 includes an N type or N– type drift region 18. The drift region 18 is provided in each of the transistor portion 70 and the diode portion 80.

In the mesa portion 60 of the transistor portion 70, the emitter region 12 of the N+ type and the base region 14 of the P– type are provided in order from the upper surface 21 side of the semiconductor substrate 10. The drift region 18 is provided below the base region 14. The mesa portion 60 may be provided with an accumulation region 16 of an N+ type. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. That is, the donor concentration of the accumulation region 16 is higher than that of the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P– type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 may have a concentration peak having a higher doping concentration than the doping concentration of the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may have two or more concentration peaks in the depth direction (the Z axis direction) of the semiconductor substrate 10. The concentration peak of the buffer region 20 may be provided at the same depth position as, for example, a chemical concentration peak of hydrogen (a proton) or phosphorus. The buffer region 20 may function as a field stopper layer which prevents a depletion layer expanding from the lower end of the base region 14 from reaching the collector region 22 of the P+ type and the cathode region 82 of the N+ type.

In the transistor portion 70, the collector region 22 of the P+ type is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorus. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and is provided to below the base region 14. In a region where at least any one of the emitter region 12, the contact region 15, and the accumulation region 16 is provided, each trench portion also penetrates these doping regions. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary between the diode portion 80 and the transistor portion 70 in the X axis direction in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided to cover an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. Note that the bottom portions of the dummy trench portion 30 and the gate trench portion 40 may be formed in a curved-surface shape (a curved-line shape in the cross section) convexly downward. In the present specification, a depth position of a lower end of the gate trench portion 40 is set as Zt.

The semiconductor device 100 of this example includes a lifetime control portion 200 that controls a carrier lifetime. The lifetime control portion 200 is a region where a carrier lifetime shows a local minimum value in the depth direction of the semiconductor substrate 10. Since carriers are captured by lattice defects in a region where many lattice defects remain, a carrier lifetime becomes short. By controlling the carrier lifetime, characteristics such as a turn-off time of the semiconductor device 100 can be controlled. In this example, by radiating a charged particle beam such as a helium ion beam to a predetermined depth position, lattice defects are formed in the vicinity of the depth position to thus form the lifetime control portion 200. The lifetime control portion 200 of this example is provided in the buffer region 20 in the transistor portion 70 and the diode portion 80.

Figure 4:
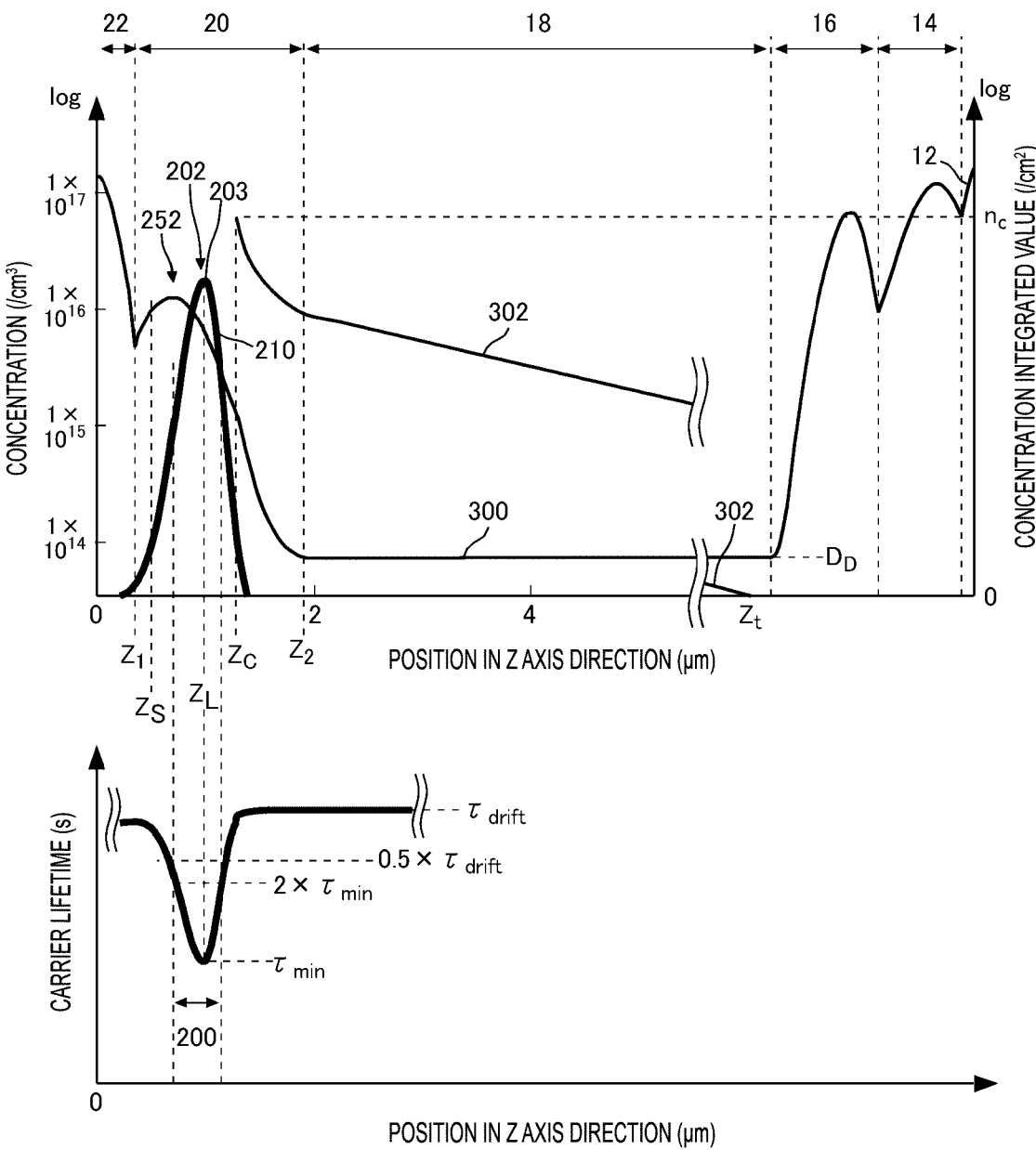
FIG. 4 illustrates an example of a doping concentration distribution 300 on a line f-f of FIG. 3.

FIG. 4 illustrates an example of a doping concentration distribution 300 on a line f-f of FIG. 3. FIG. 4 also shows a distribution of the carrier lifetime on a part of the line f-f. The line f-f is a line parallel to the Z axis that passes through the mesa portion 60. The horizontal axis in FIG. 4 represents a position in the Z axis direction in the semiconductor substrate 10. In the present specification, using the lower surface 23 of the semiconductor substrate 10 as a reference position in the Z axis direction, a distance from the lower surface 23 is set as a position in the Z axis direction.

As shown in FIG. 3, the semiconductor substrate 10 is provided with the drift region 18. The doping concentration of the drift region 18 may be substantially constant. The doping concentration of the drift region 18 may be identical to the bulk donor concentration. In another example, the doping concentration of the drift region 18 may be higher than the bulk donor concentration. The emitter region 12, the base region 14, and the accumulation region 16 are provided on the upper surface 21 side of the semiconductor substrate 10. The emitter region 12, the base region 14, and the accumulation region 16 may each have a doping concentration peak.

The buffer region 20 is provided between the drift region 18 and the lower surface 23. The buffer region 20 has one or more doping concentration peaks 252 having a higher doping concentration than the drift region 18. The collector region 22 is provided between the buffer region 20 and the lower surface 23. The collector region 22 may have a doping concentration peak.

A depth position of the lower end of the buffer region 20 is set as $Z_1$. The depth position $Z_1$ in this example is a position of a PN junction between the buffer region 20 and the collector region 22. A depth position of the upper end of the buffer region 20 is set as $Z_2$. The depth position $Z_2$ is a position of a boundary between the buffer region 20 and the drift region 18. The depth position $Z_2$ may be a position at which the doping concentration starts to increase from a doping concentration DD of the drift region 18 in a direction from the drift region 18 toward the lower surface 23, or may be a position at which the doping concentration becomes 1.5 times or 2 times of the doping concentration DD of the drift region 18.

The buffer region 20 is provided with the lifetime control portion 200. As shown in FIG. 4, the lifetime control portion 200 is a region where the carrier lifetime shows a local minimum value $\tau_{min}$ in the depth direction. The depth position at which the carrier lifetime shows the local minimum value $\tau_{min}$ is set as $Z_L$. In the distribution of the carrier lifetime in the depth direction, a region where the carrier lifetime becomes $2 \times \tau_{min}$ or less in the vicinity of the depth position $Z_L$ may be the lifetime control portion 200. In another example, a region where the carrier lifetime becomes $5 \times \tau_{min}$ or less in the vicinity of the depth position $Z_L$ may be the lifetime control portion 200, or a region where the carrier lifetime becomes $10 \times \tau_{min}$ or less in the vicinity of the depth position $Z_L$ may be the lifetime control portion 200. In another example, a region where the carrier lifetime in the vicinity of the depth position $Z_L$ becomes 80% or less (0.8 times or less) of the carrier lifetime $\tau_{drift}$ of the drift region 18 may be the lifetime control portion 200, a region where the carrier lifetime becomes 50% or less (0.5 times or less) of the carrier lifetime $\tau_{drift}$ of the drift region 18 may be the lifetime control portion 200, or a region where the carrier lifetime becomes 20% or less (0.2 times or less) of the carrier lifetime $\tau_{drift}$ of the drift region 18 may be the lifetime control portion 200. The entire lifetime control portion 200 may be provided in the buffer region 20. In another example, a part of the lifetime control portion 200 may be provided in the drift region 18. Also in this case, the depth position $Z_L$ is arranged in the buffer region 20.

The buffer region 20 of this example includes helium having a helium concentration distribution 210 at a position overlapping the lifetime control portion 200. The helium concentration distribution 210 has a helium concentration peak 202 at the depth position $Z_L$. A position of a local maximum 203 of the helium concentration peak 202 may or may not match with the depth position $Z_L$. When not matched, the local maximum 203 of the helium concentration peak 202 may be positioned within a range of 10% to 30% of the depth position $Z_L$ from the depth position $Z_L$. In another example, concentration peaks of other impurities such as hydrogen and argon may be included in place of the helium concentration peak 202. The impurities only need to be those that are capable of forming lattice defects by being radiated onto the semiconductor substrate 10, to thus form the lifetime control portion 200. Note that in the present specification, a chemical concentration (atoms/cm$^3$) of helium per unit area is simply referred to as the helium concentration.

The helium concentration peak 202 overlapping the lifetime control portion 200 means that, for example, the local maximum 203 of the helium concentration peak 202 is arranged in the lifetime control portion 200. In another example, it may mean that the depth position $Z_L$ is arranged within a full width at half maximum of the helium concentration peak 202. A region of the full width at half maximum of the helium concentration peak 202 may be the lifetime control portion 200. The position of the local maximum 203 of the helium concentration peak 202 may be used as the depth position $Z_L$ at which the carrier lifetime shows the local minimum value $\tau_{min}$.

The semiconductor substrate 10 has a critical depth position $Z_C$ at which an integrated value 302, which is obtained by integrating doping concentrations from the upper end of the drift region 18 toward the lower surface 23 of the semiconductor substrate 10, reaches a critical integrated concentration $n_C$ of the semiconductor substrate 10. When the drift region 18 and the accumulation region 16 are in contact with each other, the upper end of the drift region 18 is a boundary between the accumulation region 16 and the drift region 18. When the drift region 18 and the base region 14 are in contact with each other, the upper end of the drift region 18 is a PN junction portion between the base region 14 and the drift region 18. Further, the lower end position $Z_t$ of the gate trench portion 40 may be the upper end position of the drift region 18. In the example of FIG. 4, the lower end position $Z_t$ is set as the upper end position of the drift region 18.

The critical integrated concentration $n_C$ is expressed by the following expression, for example.

$$n_C = \varepsilon s \times Ec/q$$

Note that εs represents a dielectric constant of the material forming the semiconductor substrate 10, q represents an elementary charge, and Ec represents a dielectric destruction electric field intensity of the semiconductor substrate 10. εs is a value obtained by multiplying a dielectric constant EU in vacuum by a relative permittivity $\varepsilon_r$ of the material forming the semiconductor substrate 10. For example, when the semiconductor substrate 10 is a silicon substrate, Ec is $1.8 \times 10^5$ to $2.5 \times 10^5$ (V/cm), and $n_C$ is $1.2 \times 10^{12}$ to $1.6 \times 10^{12}$ (/cm²).

Further, when a forward bias, with a gate voltage being 0 V or less, is applied between the collector electrode 24 and the emitter electrode 52 and a maximum value of the electric field intensity reaches a dielectric destruction electric field intensity of the semiconductor substrate 10 to cause an avalanche breakdown, and when up to a particular position of the drift region 18 is depleted (changed into a space charge region), a value obtained by integrating the donor concentrations from the lower end of the gate trench portion 40 to the particular position corresponds to the critical integrated concentration $n_C$. In other words, the critical depth position $Z_C$ is the particular position, and is a position that the depletion layer (space charge region) is capable of reaching when the avalanche breakdown occurs. Even when the avalanche breakdown occurs, the depletion layer does not reach the lower surface 23 side from the critical depth position $Z_C$.

The semiconductor substrate 10 has a short-circuit-time reaching position $Z_S$ that the depletion layer expanding from the upper end of the drift region 18 toward the lower surface 23 reaches, when the semiconductor device 100 is in a short-circuited state. The short-circuited state of the semiconductor device 100 refers to a state where two semiconductor devices 100 that are connected in series and controlled to be turned on and off complementarily are in an on-state at the same time. In the short-circuited state, a large collector-emitter voltage is applied to one semiconductor device 100, and thus an extremely large current flows. A lower end position of the depletion layer in this state is set as the short-circuit-time reaching position $Z_S$. The short-circuited state and the short-circuit-time reaching position $Z_S$ will be described later.

Figure 5:
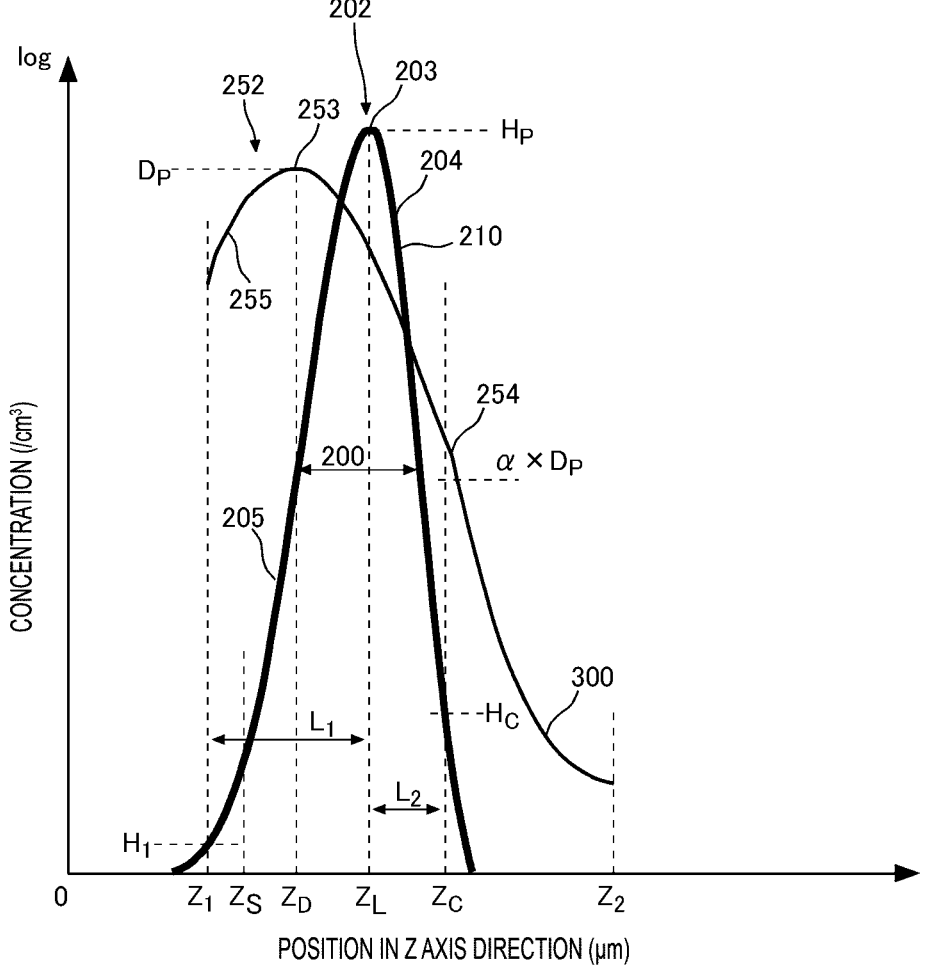
FIG. 5 is an enlarged view of the doping concentration distribution 300, a lifetime control portion 200, and a helium concentration peak 202 in a buffer region 20.

FIG. 5 is an enlarged view of the doping concentration distribution 300, the lifetime control portion 200, and the helium concentration peak 202 in the buffer region 20. Although a region of the full width at half maximum of the helium concentration peak 202 in the helium concentration distribution 210 is set as the lifetime control portion 200 in this example, the position of the lifetime control portion 200 may also be determined according to the carrier lifetime distribution as shown in FIG. 4.

The doping concentration peak 252 has a local maximum 253, a lower tail 255, and an upper tail 254. A depth position of the local maximum 253 is set as $Z_D$. A doping concentration at the local maximum 253 is set as $D_P$ (/cm³). The lower tail 255 is a portion where the doping concentration monotonically decreases from the local maximum 253 toward the lower surface 23. The lower tail 255 may be a portion from the depth position $Z_D$ to the depth position $Z_1$. The upper tail 254 is a portion where the doping concentration monotonically decreases from the local maximum 253 toward the upper surface 21. The upper tail 254 may be a portion from the depth position $Z_D$ to the depth position $Z_2$.

The helium concentration peak 202 of the helium concentration distribution 210 has the local maximum 203, a lower tail 205, and an upper tail 204. The depth position of the local maximum 203 is set as $Z_L$. A doping concentration at the local maximum 203 is set as $H_P$ (/cm³). The lower tail 205 is a portion where the helium concentration monotonically decreases from the local maximum 203 toward the lower surface 23. The upper tail 204 is a portion where the helium concentration monotonically decreases from the local maximum 203 toward the upper surface 21.

The lifetime control portion 200 is provided at a position overlapping a shallowest concentration peak closest to the lower surface 23 of the semiconductor substrate 10 among the doping concentration peaks 252 provided in the buffer region 20. Since the buffer region 20 of this example has a single doping concentration peak 252, the doping concentration peak 252 is the shallowest concentration peak.

The lifetime control portion 200 overlapping the doping concentration peak 252 may mean that the depth position $Z_L$ of the lifetime control portion 200 is arranged within a range in which the doping concentration becomes $\alpha \times D_P$ or more in the vicinity of the local maximum 253 of the doping concentration peak 252. For example, a may be 5%, 10%, 20%, or 50%. A lower end position of the range may be the depth position $Z_1$. The range in this case is from the depth position $Z_1$ to a position at which the doping concentration becomes $\alpha \times D_P$ in the upper tail 254.

The depth position $Z_L$ is arranged closer to the lower surface 23 than the critical depth position $Z_C$. In other words, the local maximum 203 of the helium concentration peak 202 is arranged closer to the lower surface 23 than the critical depth position $Z_C$. With this configuration, it becomes possible to suppress a situation where the depletion layer reaches the depth position $Z_L$. Although a leakage current increases when the depletion layer reaches a region where many lattice defects exist, the leakage current can be suppressed according to this example. It is preferable for the entire lifetime control portion 200 to be arranged closer to the lower surface 23 than the critical depth position $Z_C$.

Note that the depth position $Z_L$ is arranged closer to the upper surface 21 than the depth position $Z_1$ of the lower end of the buffer region 20. Formation of many lattice defects in the collector region 22 may affect characteristics of the semiconductor device 100. It is preferable for the entire lifetime control portion 200 to be arranged closer to the upper surface 21 than the depth position $Z_1$.

A width of the lifetime control portion 200 in the depth direction may be smaller than a width of the shallowest concentration peak (the doping concentration peak 252 in this example) in the depth direction. With this configuration, the entire lifetime control portion 200 can be arranged within the shallowest concentration peak. The width of the lifetime control portion 200 may be 75% or less of the width of the shallowest concentration peak, or may be 50% or less. Note that the width of the doping concentration peak 252 may be a width of the range in which the doping concentration becomes $\alpha \times D_P$ or more in the vicinity of the local maximum 253 of the doping concentration peak 252. The lower end position of the range may be the depth position $Z_1$.

The width of the doping concentration peak 252, which is the shallowest concentration peak, in the depth direction may be 1 μm or more. The width may be 2 μm or more, or may be 3 μm or more. The width of the doping concentration peak 252, which is the shallowest concentration peak, in the depth direction may be 10 μm or less, 7 μm or less, or 5 μm or less. The width of the lifetime control portion 200 may be smaller than 1 μm, 0.75 μm or less, or 0.5 μm or less. The width of the lifetime control portion 200 may be 0.1 μm or more, 0.2 μm or more, or 0.3 μm or more.

A distance between the collector region 22 and the local maximum 203 of the helium concentration peak 202 is set as $L_1$. The distance $L_1$ in this example is a distance from the depth position $Z_1$ to the depth position $Z_L$. A distance between the critical depth position $Z_C$ and the local maximum 203 (the depth position $Z_L$) is set as $L_2$. The distance $L_1$ may be larger than the distance $L_2$. When a lattice defect is formed at a boundary (PN junction) between the collector region 22 and the buffer region 20, implantation of holes from the collector region 22 to the buffer region 20 and the drift region 18 may be suppressed, to thus cause an increase of an on-voltage. According to this example, it is possible to suppress formation of a lattice defect in the collector region 22 or the boundary (PN junction) between the collector region 22 and the buffer region 20, and suppress an increase of the on-voltage of the semiconductor device 100. The distance $L_1$ may be 1.5 times or more or 2 times or more of the distance $L_2$. Note that the distance $L_1$ may be equal to or smaller than the distance $L_2$. Also in this case, it is preferable for the entire lifetime control portion 200 to be provided closer to the upper surface 21 than the depth position $Z_1$.

As shown in FIG. 5, the local maximum 203 of the helium concentration peak 202 may be arranged closer to the upper surface 21 than the local maximum 253 of the doping concentration peak 252. In another example, the local maximum 203 may be arranged closer to the lower surface 23 than the local maximum 253.

The helium concentration at the boundary between the collector region 22 and the buffer region 20 (the depth position $Z_1$ in this example) is set as $H_1$. The helium concentration $H_1$ may be $1/10$ or less of the helium concentration $H_P$ at the local maximum 203 of the helium concentration peak 202. With this configuration, the number of lattice defects formed in the collector region 22 can be reduced. The helium concentration $H_1$ may be $1/100$ or less or $1/1000$ or less of the helium concentration $H_P$. The helium concentration $H_1$ may be 0 atoms/cm$^3$.

The helium concentration at the critical depth position $Z_C$ is set as $H_C$. At the critical depth position $Z_C$ of this example, the upper tail 204 of the helium concentration peak 202 is provided. The helium concentration $H_C$ may be $1/10$ or less of the helium concentration $H_P$ at the local maximum 203 of the helium concentration peak 202. With this configuration, it is possible to reduce the number of lattice defects provided closer to the upper surface 21 than the critical depth position $Z_C$ and suppress a leakage current. The helium concentration $H_C$ may be $1/100$ or less or $1/1000$ or less of the helium concentration $H_P$. The helium concentration $H_C$ may be 0 atoms/cm$^3$.

The helium concentration $H_C$ at the critical depth position $Z_C$ may be higher than the helium concentration $H_1$ at the depth position $Z_1$. With this configuration, the number of lattice defects formed in the collector region 22 can be reduced. The helium concentration $H_1$ may be $1/2$ or less, $1/5$ or less, or $1/10$ or less of the helium concentration $H_C$.

Figure 6:
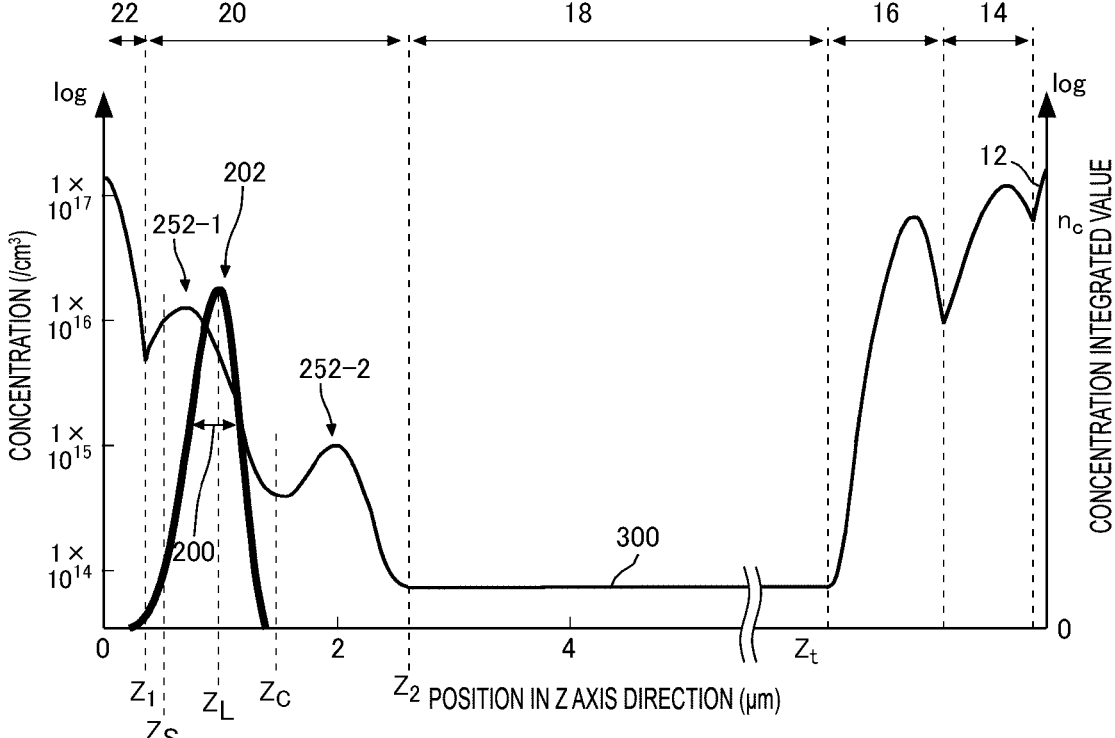
FIG. 6 illustrates another example of the doping concentration distribution 300.

FIG. 6 illustrates another example of the doping concentration distribution 300. The doping concentration distribution 300 of this example has a plurality of doping concentration peaks 252 in the buffer region 20. Although FIG. 6 shows two doping concentration peaks, that is, doping concentration peaks 252-1 and 252-2, the buffer region 20 may have three or more doping concentration peaks 252.

In the example of FIG. 6, the doping concentration peak 252-1 is the shallowest concentration peak. The lifetime control portion 200 and the helium concentration peak 202 are provided at positions similar to those of the lifetime control portion 200 and the helium concentration peak 202 described in FIGS. 4 and 5. The doping concentration peak 252-1 is similar to the doping concentration peak 252 described in FIGS. 4 and 5.

The doping concentration peak 252-2 is provided closer to the upper surface 21 than the doping concentration peak 252-1. Each of the doping concentration peaks 252 may be arranged on the lower surface 23 side of the semiconductor substrate 10. Among the plurality of doping concentration peaks 252, the doping concentration peak 252-1 may be a concentration peak having a largest doping concentration $D_P$ at the local maximum 203.

Each of the doping concentration peaks 252 described in FIGS. 4 to 6 may be a concentration peak of a hydrogen donor, or may be a concentration peak of phosphorus. The buffer region 20 may have both the doping concentration peak 252 of the hydrogen donor and the doping concentration peak 252 of phosphorus. In this case, the doping concentration peak 252-1 which is the shallowest concentration peak may be the concentration peak of phosphorus.

Figure 7A:
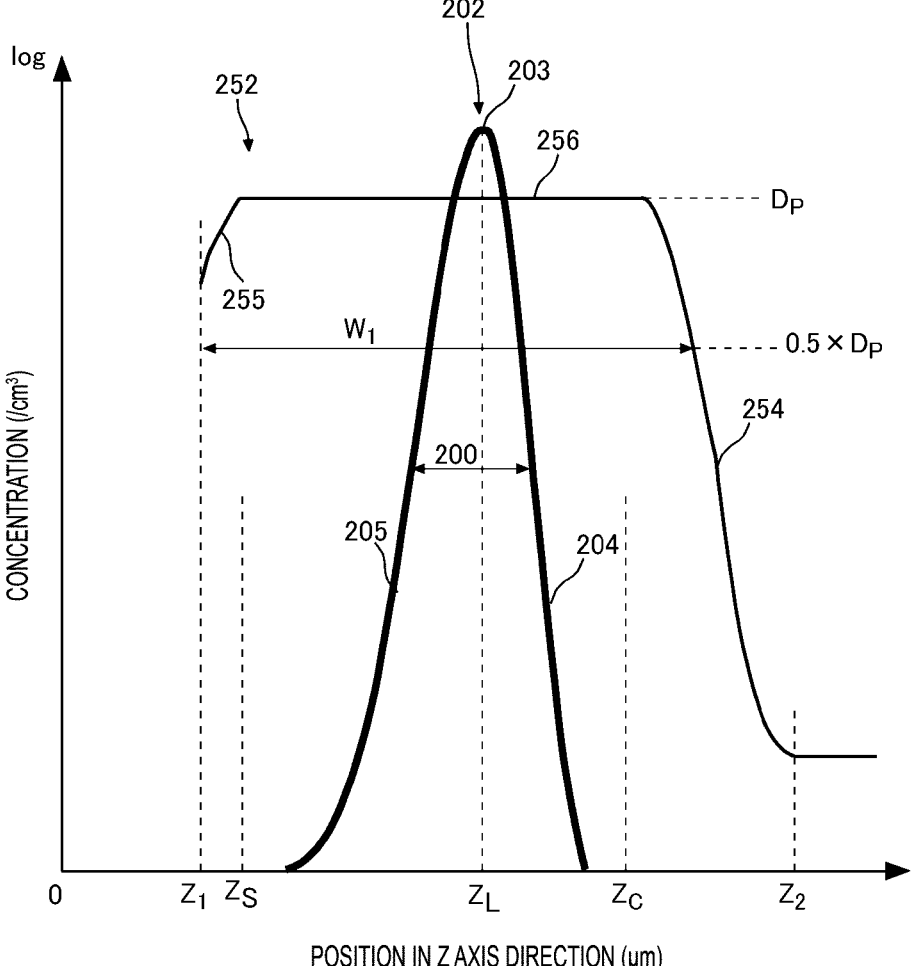
FIG. 7A illustrates another example of a doping concentration peak 252 which is a shallowest concentration peak.

FIG. 7A illustrates another example of the doping concentration peak 252 which is the shallowest concentration peak. The doping concentration peak 252 of this example has a flat portion 256. This example is similar to the examples shown in FIGS. 4 to 6 except that the doping concentration peak 252 has the flat portion 256.

The flat portion 256 is a region where the doping concentration becomes substantially constant in the depth direction. Substantially constant may mean that a concentration variation per unit length (1 μm) in the depth direction is 10 times or less, 5 times or less, 3 times or less, or 2 times or less. The concentration variation being 10 times or less means that a maximum value of the doping concentration is 10 times or less of a minimum value of the doping concentration, in a range of the unit length in the depth direction. The flat portion 256 is arranged between the lower tail 255 and the upper tail 254. The flat portion 256 may have a length of 0.3 μm or more, a length of 0.5 μm or more, or a length of 1 μm or more in the depth direction. The flat portion 256 may have a length of 10 μm or less, a length of 5 μm or less, or a length of 3 μm or less in the depth direction. The depth position $Z_L$ may be arranged in the flat portion 256. The entire lifetime control portion 200 may be arranged in the flat portion 256.

A full width at half maximum of the doping concentration peak 252 which is the shallowest concentration peak is set as $W_1$. Note that a lower end position of the region of the full width at half maximum may be the depth position $Z_1$. The full width at half maximum $W_1$ is 2.2 times or more of a predetermined standard full width at half maximum. By setting the full width at half maximum $W_1$ of the doping concentration peak 252 to become large, the entire lifetime control portion 200 can be easily provided in the doping concentration peak 252. In addition, the entire lifetime control portion 200 can be easily provided between the depth position $Z_1$ and the critical depth position $Z_C$.

The standard full width at half maximum is a full width at half maximum that is determined by setting the depth position $Z_D$ of the local maximum 253 of the doping concentration peak 252 as a projected range at a time of implanting the impurity, with respect to projected range-full width at half maximum characteristics corresponding to the material of the semiconductor substrate 10 and a type of the impurity contained in the buffer region 20. Note that when the doping concentration peak 252 has the flat portion 256, a center position of the flat portion 256 in the depth direction may be used as the depth position $Z_D$.

When implanting the impurity into the semiconductor substrate 10 in a predetermined projected range (that is, the depth position in the semiconductor substrate 10), the impurity is distributed with a certain amount of variations in the depth direction. A variation amount (straggling) of the depth position for implanting the impurity is determined according to a projected range of the impurity (that is, an acceleration energy when implanting the impurity). Note that the variation amount depends on the material of the semiconductor substrate 10 and the type of the impurity to be implanted.

In other words, the standard full width at half maximum corresponds to a full width at half maximum in a normal state where the impurity is implanted while the projected range is fixed to the depth position $Z_p$ and heat treatment is not performed. The standard full width at half maximum may be a full width at half maximum when the impurity is implanted perpendicular to the upper surface of the semiconductor substrate 10. In contrast, in the semiconductor device 100, the full width at half maximum $W_1$ of the doping concentration distribution of the doping concentration peak 252 is set to be sufficiently larger than the standard full width at half maximum. The full width at half maximum $W_1$ may be 3 times or more, 4 times or more, or 5 times or more of the standard full width at half maximum.

The doping concentration peak 252 having a large full width at half maximum can be formed by implanting the impurity into the semiconductor substrate 10 in a plurality of different types of projected ranges. By performing heat treatment such as annealing at a predetermined temperature and time as appropriate after implanting the impurity, the doping concentration peak 252 as shown in FIG. 7A, for example, can be formed. Note that the method of forming the doping concentration peak 252 is not limited to this. When forming the doping concentration peaks 252 of the respective examples described in FIGS. 4 to 7A, the impurity may be implanted obliquely with respect to the lower surface 23 of the semiconductor substrate 10, or the impurity may be implanted perpendicularly.

Figure 7B:
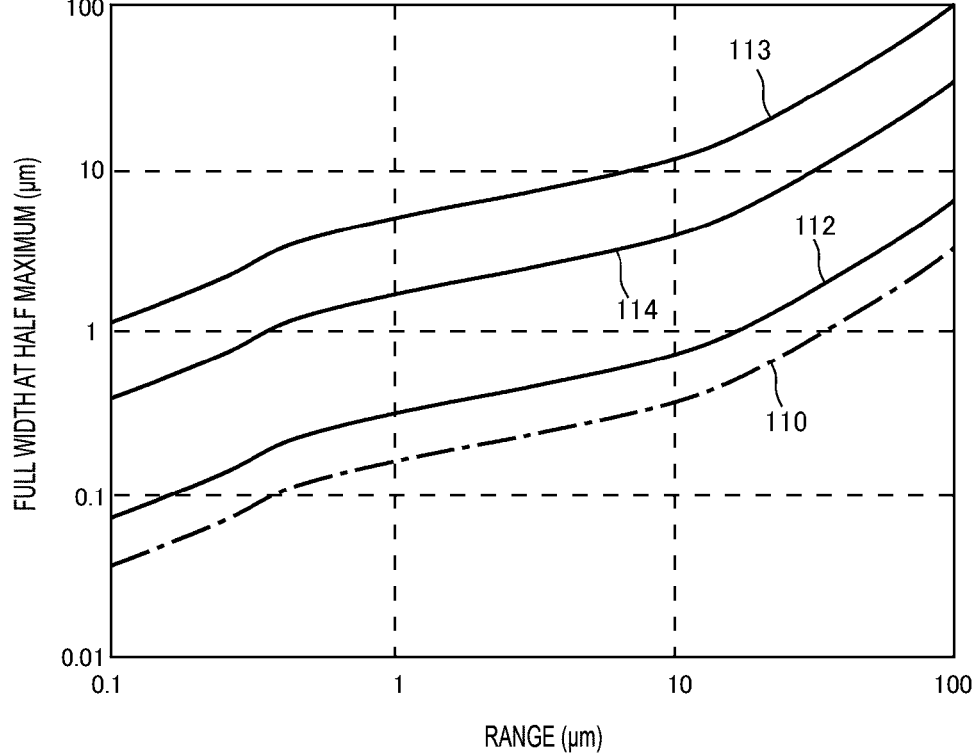
FIG. 7B illustrates an example of projected range-full width at half maximum characteristics.

FIG. 7B illustrates an example of the projected range-full width at half maximum characteristics. In FIG. 7B, the semiconductor substrate 10 is a silicon substrate, and the impurity to be implanted is phosphorus. The standard full width at half maximum in each of the projected ranges is obtained by implanting the impurity into the semiconductor substrate 10 in the projected range, and measuring the distribution of the impurity in a state where the heat treatment is not performed. As an example, the projected range-full width at half maximum characteristics when phosphorus is implanted into the silicon substrate can be approximated by the following expression.

$$y=0.01763x^6-0.11077x^5-0.15065x^4-0.21668x^3-\\0.30410x^2-0.39392x-0.77003 \quad \text{Expression 1}$$

Note that x represents a common logarithm of a projected range Rp (µm) ($\log_{10}$ (Rp)), and y represents a common logarithm of the full width at half maximum $W_1$ (µm) ($\log_{10}$ ($W_1$)). Also for other substrate materials and impurities, the projected range-full width at half maximum characteristics can be measured as described above. Further, a standard full width at half maximum in a certain projected range may be calculated by a linear approximation between a standard full width at half maximum measured in the doping concentration peak 252 formed with a projected range larger than the projected range and a standard full width at half maximum measured in the doping concentration peak 252 formed with a projected range smaller than the projected range. The curve 110 of FIG. 7B corresponds to Expression 1. The curve 112 is a curve obtained by multiplying the full width at half maximum of the curve 110 by 2.2. The curve 114 is a curve obtained by multiplying the full width at half maximum of the curve 110 by 10. The curve 113 is a curve obtained by multiplying the full width at half maximum of the curve 110 by 30. The full width at half maximum $W_1$ of the doping concentration distribution of the doping concentration peak 252 may be 2.2 times or more of the standard full width at half maximum. The full width at half maximum $W_1$ of the doping concentration distribution of the doping concentration peak 252 may be 30 times or less, 20 times or less, 10 times or less, 8 times or less, or 6 times or less of the standard full width at half maximum. Also when implanting the impurity into the semiconductor substrate 10 other than the silicon substrate, a standard full width at half maximum in a certain projected range may be calculated by similarly approximating the projected range-full width at half maximum characteristics.

Figure 8:
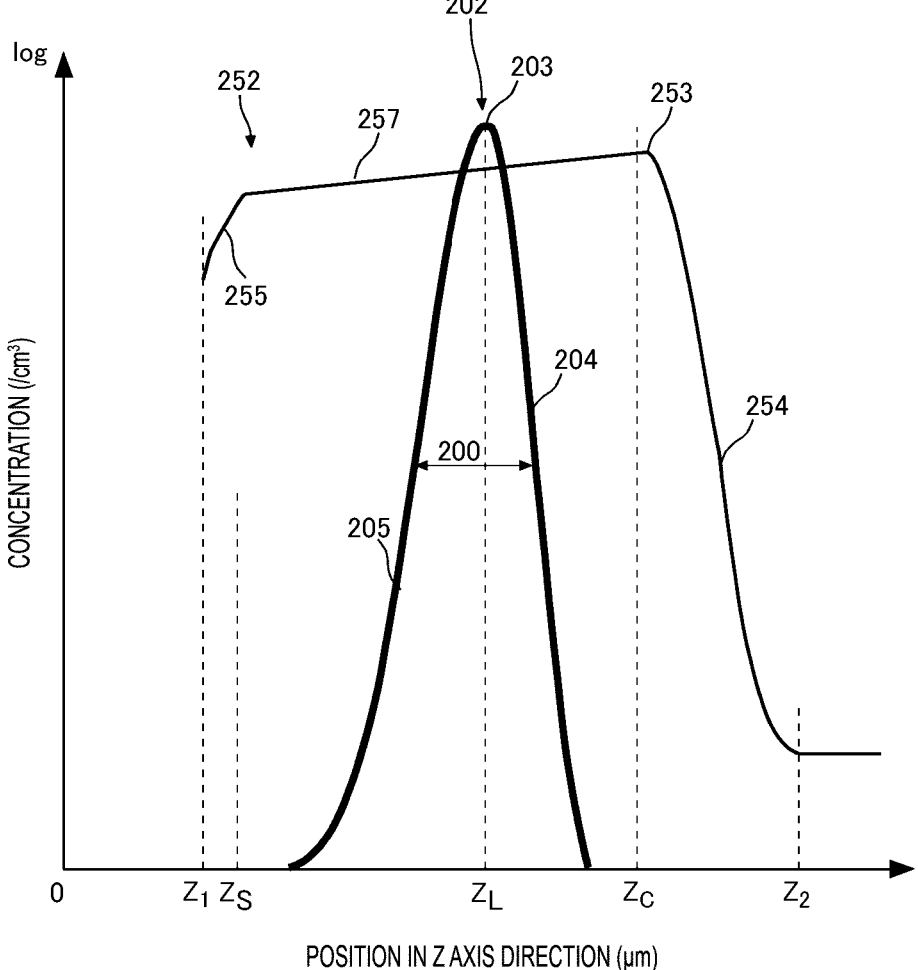
FIG. 8 illustrates another example of the doping concentration peak 252 which is the shallowest concentration peak.

FIG. 8 illustrates another example of the doping concentration peak 252 which is the shallowest concentration peak. The doping concentration peak 252 of this example has a slope portion 257. This example is similar to the examples shown in FIGS. 4 to 7B except that the doping concentration peak 252 has the slope portion 257.

The slope portion 257 is a region where the doping concentration monotonically increases a little at a time from the lower surface 23 toward the upper surface 21. A ratio of a doping concentration at an upper end of the slope portion 257 to a doping concentration at a lower end of the slope portion 257 may be 10 times or less, 5 times or less, 3 times or less, or 2 times or less. The slope portion 257 is arranged between the lower tail 255 and the upper tail 254. The slope portion 257 may have a length of 0.3 µm or more, a length of 0.5 µm or more, or a length of 1 µm or more in the depth direction. The slope portion 257 may have a length of 10 µm or less, a length of 5 µm or less, or a length of 3 µm or less in the depth direction. A boundary between the slope portion 257 and the upper tail 254 may be the local maximum 253. The depth position $Z_L$ may be arranged in the slope portion 257. The entire lifetime control portion 200 may be arranged in the slope portion 257.

Figure 9:
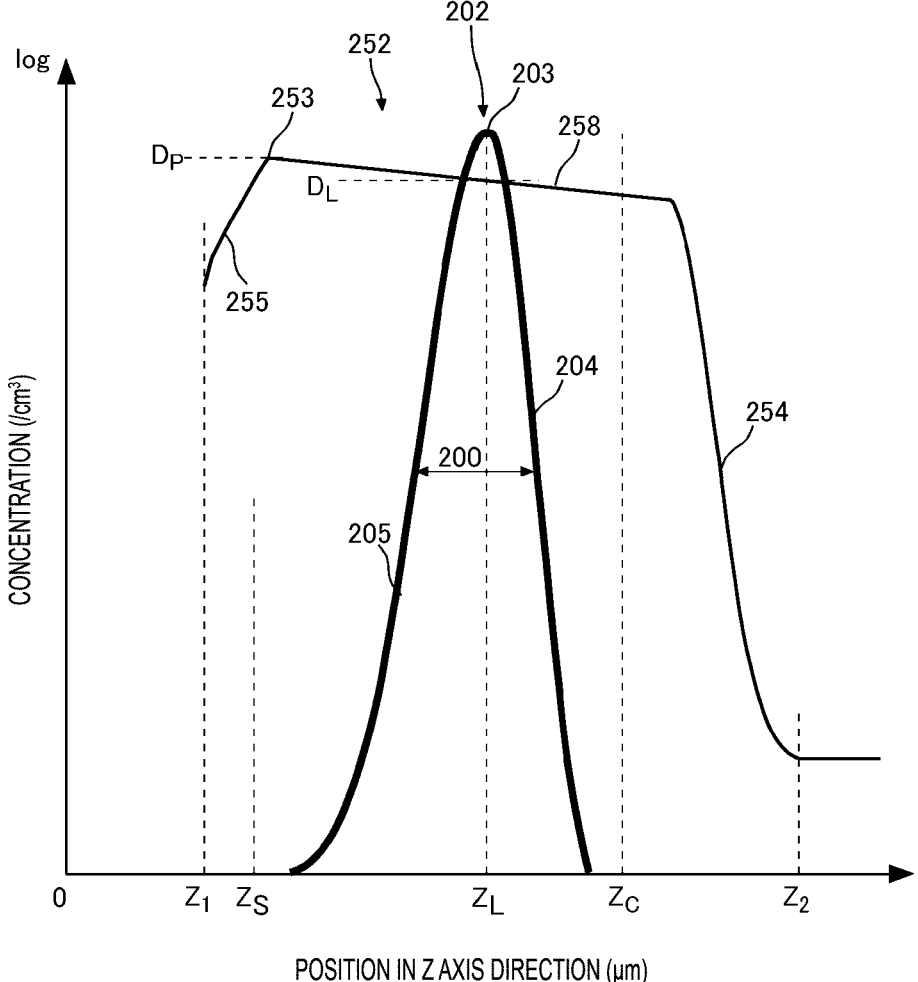
FIG. 9 illustrates another example of the doping concentration peak 252 which is the shallowest concentration peak.

FIG. 9 illustrates another example of the doping concentration peak 252 which is the shallowest concentration peak. The doping concentration peak 252 of this example has a slope portion 258. This example is similar to the examples shown in FIGS. 4 to 7B except that the doping concentration peak 252 has the slope portion 258.

The slope portion 258 is a region where the doping concentration monotonically decreases a little at a time from the lower surface 23 toward the upper surface 21. A ratio of a doping concentration at a lower end of the slope portion 258 to a doping concentration at an upper end of the slope portion 258 may be 10 times or less, 5 times or less, 3 times or less, or 2 times or less. The slope portion 258 is arranged between the lower tail 255 and the upper tail 254. The slope portion 258 may have a length of 0.3 µm or more, a length of 0.5 µm or more, or a length of 1 µm or more in the depth direction. The slope portion 258 may have a length of 10 µm or less, a length of 5 µm or less, or a length of 3 µm or less in the depth direction. A boundary between the slope portion 258 and the lower tail 255 may be the local maximum 253. The depth position $Z_L$ may be arranged in the slope portion 258. The entire lifetime control portion 200 may be arranged in the slope portion 258.

In the examples described in FIGS. 7A to 9, the doping concentration at the depth position $Z_L$ is set as $D_L$. A concentration ratio $D_P/D_L$ obtained by dividing a maximum value $D_P$ of the doping concentration in the doping concentration peak 252 by the doping concentration $D_L$ may be 1 or more. The concentration ratio $D_P/D_L$ may be 10 or less, 5 or less, or 3 or less.

Figure 10:
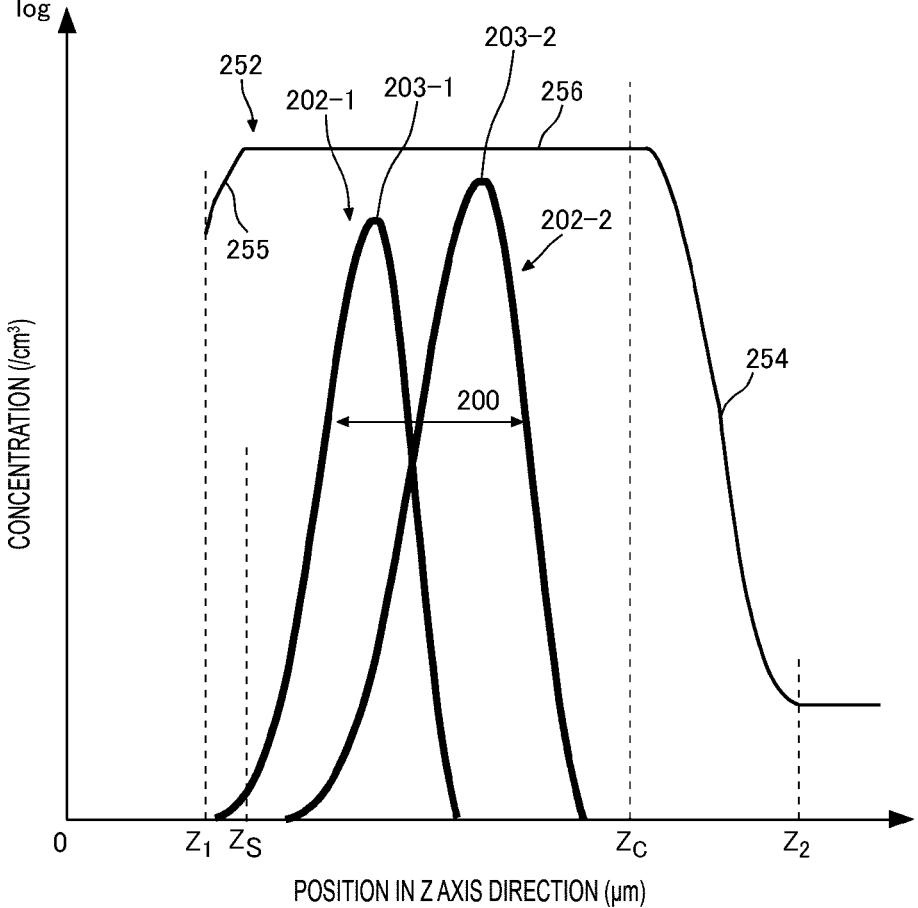
FIG. 10 illustrates another example of the buffer region 20.

FIG. 10 illustrates another example of the buffer region 20. The buffer region 20 of this example has a plurality of helium concentration peaks 202 provided at different depth positions. Although FIG. 10 shows two helium concentration peaks, that is, helium concentration peaks 202-1 and 202-2, the buffer region 20 may have three or more helium concentration peaks 202. The doping concentration distribution of the buffer region 20 in FIG. 10 is similar to that of the example of FIG. 7A, but the doping concentration distribution of the buffer region 20 may be similar to any of the examples of FIGS. 4 to 9.

The plurality of helium concentration peaks 202 may be provided at positions overlapping the doping concentration peak 252 which is the shallowest concentration peak. All of the helium concentration peaks 202 of the buffer region 20 may be provided at positions overlapping the doping concentration peak 252 which is the shallowest concentration peak. In another example, at least one of the helium concentration peaks 202 may be provided closer to the upper surface 21 than the doping concentration peak 252 which is the shallowest concentration peak. The helium concentrations at the depth positions $Z_1$, $Z_S$, and $Z_C$ may be similar to those of any of the examples described in FIGS. 4 to 9.

The helium concentrations at the local maximums 203 of the respective helium concentration peaks 202 may be the same. Alternatively, a helium concentration at a local maximum 203-1 of the helium concentration peak 202-1 provided closest to the lower surface 23 may be lower than a helium concentration at a local maximum 203-2 of the other helium concentration peak 202-2 adjacent thereto on the upper surface 21 side. With this configuration, a situation where lattice defects are formed in the collector region 22 can be suppressed. The helium concentration at the local maximum 203-1 of the helium concentration peak 202-1 provided closest to the lower surface 23 may be lower than the helium concentration at the local maximum 203 of any of the other helium concentration peaks 202.

In another example, the helium concentration at the local maximum 203-2 of the helium concentration peak 202-2 provided closest to the upper surface 21 may be lower than the helium concentration at the local maximum 203-1 of the other helium concentration peak 202-1 adjacent thereto on the lower surface 23 side. With this configuration, a situation where lattice defects are formed closer to the upper surface 21 than the critical depth position $Z_C$ can be suppressed. The helium concentration at the local maximum 203-2 of the helium concentration peak 202-2 provided closest to the upper surface 21 may be lower than the helium concentration at the local maximum 203 of any of the other helium concentration peaks 202.

The two helium concentration peaks 202 adjacent to each other in the depth direction may be arranged so as to overlap each other. For example, the regions of the full width at half maximum of the respective helium concentration peaks 202 may partially overlap. By providing the plurality of helium concentration peaks 202, the concentration at each local maximum of the helium concentration peaks 202 can be made small. Moreover, by providing the plurality of helium concentration peaks 202 so as to overlap each other, a lifetime control portion 200 having a large width can be formed.

Further, in each of the examples of FIGS. 4 to 10, the width of the helium concentration peak 202 may be enlarged by causing a helium ion beam radiated onto the lower surface 23 of the semiconductor substrate 10 to enter the lower surface 23 of the semiconductor substrate 10 substantially perpendicularly. Substantially perpendicular is, for example, 3 degrees or less.

Figure 11:
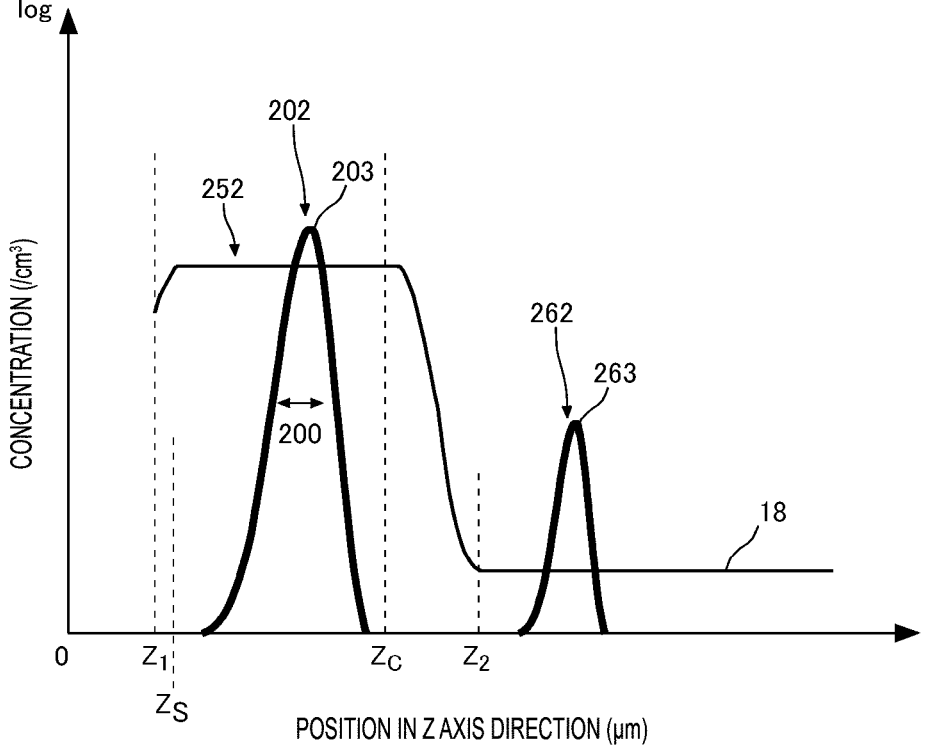
FIG. 11 illustrates another distribution example of the helium concentration.

FIG. 11 illustrates another distribution example of the helium concentration. The semiconductor substrate 10 of this example further has a second helium concentration peak 262 in addition to any of the configurations described in FIGS. 4 to 10. Other structures are similar to those of any of the examples described in FIGS. 4 to 10.

The second helium concentration peak 262 is provided in the drift region 18 on the lower surface 23 side of the semiconductor substrate 10. The buffer region 20 is provided with one or more helium concentration peaks 202 (referred to as first helium concentration peaks). A helium concentration at a local maximum 263 of the second helium concentration peak 262 may be lower than the helium concentration at the local maximum 203 of the first helium concentration peak. In this case, a leakage current that is caused when a depletion layer reaches the second helium concentration peak 262 can be suppressed. The helium concentration at the local maximum 263 of the second helium concentration peak 262 may be 1/10 or less or 1/100 or less of the helium concentration at the local maximum 203 of the first helium concentration peak. The second helium concentration peak 262 may be arranged closer to the upper surface 21 than the critical depth position $Z_C$. In another example, the helium concentration at the local maximum 263 of the second helium concentration peak 262 may be equal to or larger than the helium concentration at the local maximum 203 of the first helium concentration peak.

Figure 12:
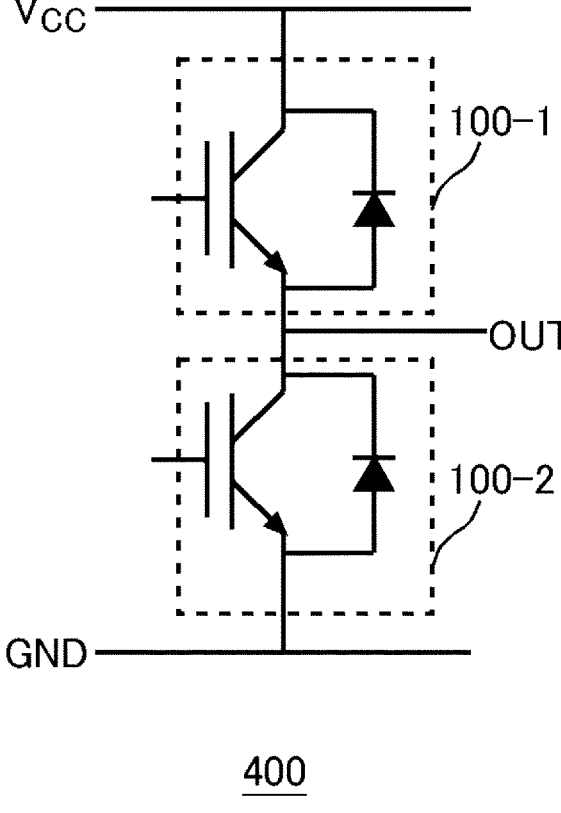
FIG. 12 illustrates an example of a semiconductor circuit 400.

FIG. 12 illustrates an example of a semiconductor circuit 400. The semiconductor circuit 400 includes two semiconductor devices 100 connected in series between a high-voltage side power supply line $V_{CC}$ and a low-voltage side power supply line GND. Gate signals for turning the two semiconductor devices 100 on and off complementarily are input to gate electrodes of the two semiconductor devices 100.

For example, when the lower semiconductor device 100-2 is turned on, control is performed to turn off the upper semiconductor device 100-1. However, the upper semiconductor device 100-1 may also be turned on for some reason so as to result in the two semiconductor devices 100 being in an on-state at the same time. Such a state is referred to as a short-circuited state. In the short-circuited state, a voltage $V_{CC}$ of the power supply line $V_{CC}$ is applied to the semiconductor device 100-1 and the semiconductor device 100-2 in the on-state. Therefore, a large through current flows from the power supply line $V_{CC}$ to the power supply line GND via the semiconductor device 100-1 and the semiconductor device 100-2. A value of the through current may be a saturation current that is determined based on a differential voltage between a gate voltage in each of the semiconductor device 100-1 and the semiconductor device 100-2 and a gate threshold.

Figure 13:
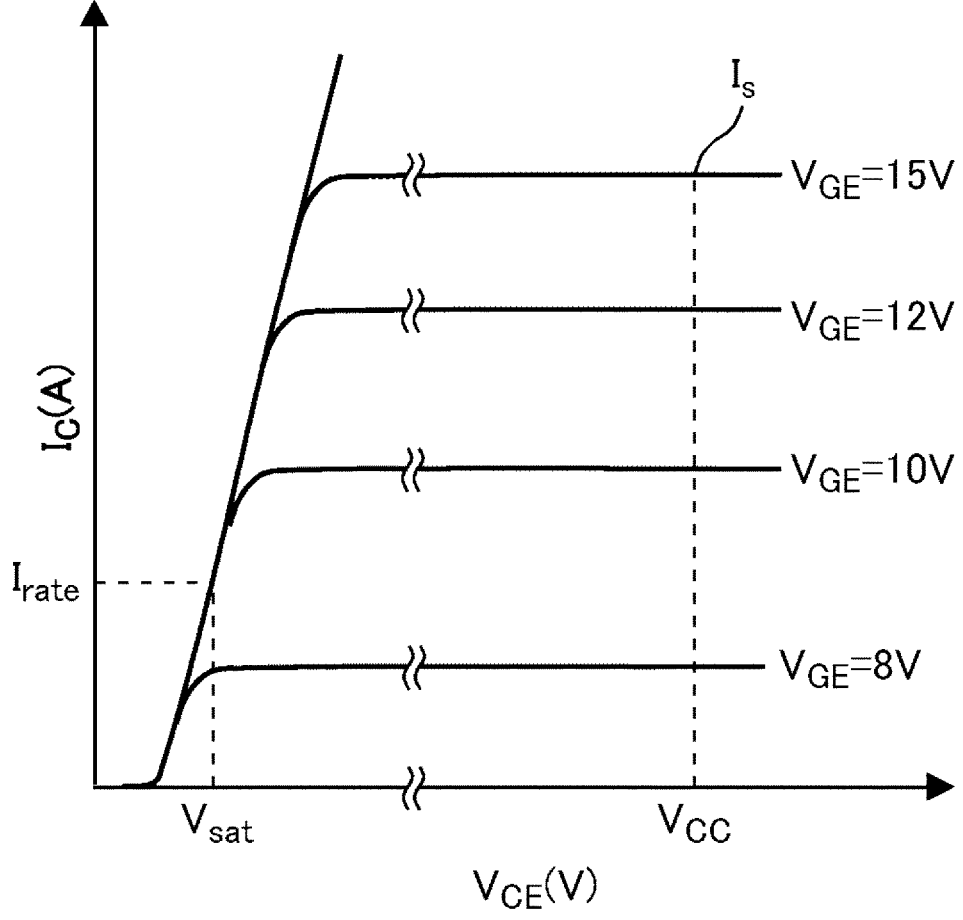
FIG. 13 illustrates an example of voltage-current characteristics of the semiconductor device 100.

FIG. 13 illustrates an example of voltage-current characteristics of the semiconductor device 100. The horizontal axis of FIG. 13 represents a collector-emitter voltage $V_{CE}$, and the ordinate axis represents a collector current $I_C$. A threshold voltage Vth of the semiconductor device 100 of this example is smaller than 8 V. Further, a gate voltage $V_{GE}$ to be applied to the gate electrode for turning on the semiconductor device 100 is 15 V.

In FIG. 13, $I_{rate}$ represents a rated current of the semiconductor device 100, and $V_{sat}$ represents a collector-emitter voltage corresponding to the rated current $I_{rate}$ in a linear region. When the semiconductor device 100 is in the short-circuited state, a voltage close to the power supply voltage $V_{CC}$ is applied between the collector and the emitter, and thus a large short-circuit current Is flows. A depth position that a depletion layer expanding from the upper end of the drift region 18 toward the lower surface 23 reaches in this state, is set as a short-circuit-time reaching position $Z_S$ described in FIG. 4 and the like.

As described in FIG. 4 and the like, at least a part of the helium concentration peak 202 may be arranged closer to the upper surface 21 than the short-circuit-time reaching position $Z_S$. The local maximum 203 of the helium concentration peak 202 may be arranged closer to the upper surface 21 than the short-circuit-time reaching position $Z_S$. The local maximum 203 of the helium concentration peak 202 may be arranged between the short-circuit-time reaching position $Z_S$ and the critical depth position $Z_C$. In addition, the whole region of the full width at half maximum of the helium concentration peak 202 may be arranged closer to the upper surface 21 than the short-circuit-time reaching position $Z_S$. The whole region of the full width at half maximum of the helium concentration peak 202 may be arranged between the short-circuit-time reaching position $Z_S$ and the critical depth position $Z_C$. Further, at least a part of the lifetime control portion 200 may be arranged closer to the upper surface 21 than the short-circuit-time reaching position $Z_S$. The entire lifetime control portion 200 may be arranged closer to the upper surface 21 than the short-circuit-time reaching position $Z_S$. The entire lifetime control portion 200 may be arranged between the short-circuit-time reaching position $Z_S$ and the critical depth position $Z_C$. According to this example, it is possible to suppress a situation where the depletion layer reaches the short-circuit-time reaching position $Z_S$, and prevent a through current from increasing due to a synergy of a leakage current during short circuit.

Further, as described in FIG. 4 and the like, when a lattice defect is formed at a boundary (PN junction) between the collector region 22 and the buffer region 20, implantation of holes from the collector region 22 to the buffer region 20 and the drift region 18 is suppressed. On the other hand, since electrons are continued to be implanted into the space charge region during short circuit, charge densities of the holes and electrons are canceled out, and the electric field intensity distribution becomes relatively flat. When the implantation of holes from the collector region 22 to the buffer region 20 and the drift region 18 is suppressed during short circuit, the electron concentration becomes higher than the hole concentration. As a result, the polarity of the space charge density is inverted, and the electric field intensity distribution increases toward the collector region 22 side. Therefore, an avalanche breakdown may be caused at a depth position relatively close to the collector region 22 to thus cause a destructive failure of the semiconductor device 100. According to this example, it is possible to suppress a reduction of the implantation of holes also during short circuit, and maintain the hole concentration to be higher than the electron concentration. With this configuration, it is possible to suppress an avalanche breakdown at a depth position relatively close to the collector region 22 during short circuit, and suppress a destructive failure of the semiconductor device 100.

Note that the short-circuit-time reaching position $Z_S$ may be determined by a device simulator. The short-circuit-time reaching position $Z_S$ may be determined by a simulation or the like using an impurity concentration profile of the semiconductor substrate 10 in the depth direction and parameters such as a power supply voltage and a gate voltage.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:
a semiconductor substrate which has an upper surface and a lower surface and is provided with a drift region of a first conductivity type;
a buffer region which is provided between the drift region and the lower surface in the semiconductor substrate and has one or more doping concentration peaks having a higher doping concentration than the drift region; and
a lifetime control portion which is provided in the buffer region at a position overlapping a shallowest concentration peak closest to the lower surface among the one or more doping concentration peaks provided in the buffer region, and in which a carrier lifetime shows a local minimum,
wherein
the semiconductor substrate has a critical depth position at which an integrated value, which is obtained by integrating doping concentrations from an upper end of the drift region toward the lower surface of the semiconductor substrate, reaches a critical integrated concentration $n_c$ of the semiconductor substrate, the critical integrated concentration $n_c$ being defined as $$n_c = \varepsilon_s \times E_c / q$$

where $\varepsilon_s$ represents a dielectric constant of a material forming the semiconductor substrate, q represents an elementary charge, and $E_c$ represents a dielectric destruction electric field intensity of the semiconductor substrate, the critical depth position being in the buffer region, and
a depth position at which the carrier lifetime shows the local minimum in the lifetime control portion is closer to the lower surface than the critical depth position.

2. The semiconductor device according to claim 1, wherein
the shallowest concentration peak is a concentration peak of phosphorus.

3. The semiconductor device according to claim 1, wherein
a width of the lifetime control portion in a depth direction is smaller than a width of the shallowest concentration peak in the depth direction.

4. The semiconductor device according to claim 1, wherein
a width of the shallowest concentration peak in a depth direction is 1 μm or more.

5. The semiconductor device according to claim 1, wherein
when a full width at half maximum, which is determined by setting a depth position of the shallowest concentration peak as a projected range at a time of implanting an impurity with respect to projected range-full width at half maximum characteristics corresponding to a material of the semiconductor substrate and a type of an impurity contained in the buffer region, is set as a standard full width at half maximum, a full width at half maximum of the shallowest concentration peak is 2.2 times or more of the standard full width at half maximum.

6. The semiconductor device according to claim 1, further comprising:

a collector region of a second conductivity type, which is provided between the buffer region and the lower surface of the semiconductor substrate, wherein the buffer region has a helium concentration peak at a position overlapping the lifetime control portion, and a helium concentration at a boundary between the collector region and the buffer region is $\frac{1}{10}$ or less of a helium concentration at a local maximum of the helium concentration peak.

7. The semiconductor device according to claim 1, wherein the buffer region has a helium concentration peak at a position overlapping the lifetime control portion, and a helium concentration at the critical depth position is $\frac{1}{10}$ or less of a helium concentration at a local maximum of the helium concentration peak.

8. The semiconductor device according to claim 1, further comprising:

a collector region of a second conductivity type, which is provided between the buffer region and the lower surface of the semiconductor substrate, wherein the buffer region has a helium concentration peak at a position overlapping the lifetime control portion, and a helium concentration at the critical depth position is higher than a helium concentration at a boundary between the collector region and the buffer region.

9. The semiconductor device according to claim 1, further comprising:

a collector region of a second conductivity type, which is provided between the buffer region and the lower surface of the semiconductor substrate, wherein the buffer region has a helium concentration peak at a position overlapping the lifetime control portion, and a distance between the collector region and a local maximum of the helium concentration peak is larger than a distance between the critical depth position and the local maximum of the helium concentration peak.

10. The semiconductor device according to claim 1, wherein the semiconductor substrate has a short-circuit-time reaching position that a depletion layer expanding from the upper end of the drift region toward the lower surface reaches when the semiconductor device is in a short-circuited state, the buffer region has a helium concentration peak at a position overlapping the lifetime control portion, and at least a part of the helium concentration peak is arranged closer to the upper surface than the short-circuit-time reaching position.

11. The semiconductor device according to claim 1, wherein the buffer region has a plurality of helium concentration peaks provided at different depth positions.

12. The semiconductor device according to claim 11, wherein a helium concentration of a helium concentration peak closest to the lower surface of the semiconductor substrate among the plurality of helium concentration peaks is lower than a helium concentration of other helium concentration peaks.

13. The semiconductor device according to claim 1, wherein the buffer region has a first helium concentration peak at a position overlapping the lifetime control portion, and the drift region has a second helium concentration peak on a side of the lower surface of the semiconductor substrate.

14. The semiconductor device according to claim 13, wherein the second helium concentration peak has a lower helium concentration than the first helium concentration peak.

15. The semiconductor device according to claim 2, wherein a width of the lifetime control portion in a depth direction is smaller than a width of the shallowest concentration peak in the depth direction.

16. The semiconductor device according to claim 2, wherein a width of the shallowest concentration peak in a depth direction is 1 μm or more.

17. The semiconductor device according to claim 3, wherein the width of the shallowest concentration peak in the depth direction is 1 μm or more.

18. The semiconductor device according to claim 2, wherein when a full width at half maximum, which is determined by setting a depth position of the shallowest concentration peak as a projected range at a time of implanting an impurity with respect to projected range-full width at half maximum characteristics corresponding to a material of the semiconductor substrate and a type of an impurity contained in the buffer region, is set as a standard full width at half maximum, a full width at half maximum of the shallowest concentration peak is 2.2 times or more of the standard full width at half maximum.

19. The semiconductor device according to claim 3, wherein when a full width at half maximum, which is determined by setting a depth position of the shallowest concentration peak as a projected range at a time of implanting an impurity with respect to projected range-full width at half maximum characteristics corresponding to a material of the semiconductor substrate and a type of an impurity contained in the buffer region, is set as a standard full width at half maximum, a full width at half maximum of the shallowest concentration peak is 2.2 times or more of the standard full width at half maximum.

20. The semiconductor device according to claim 4, wherein when a full width at half maximum, which is determined by setting a depth position of the shallowest concentration peak as a projected range at a time of implanting an impurity with respect to projected range-full width at half maximum characteristics corresponding to a material of the semiconductor substrate and a type of an impurity contained in the buffer region, is set as a standard full width at half maximum, a full width at half maximum of the shallowest concentration peak is 2.2 times or more of the standard full width at half maximum.

\* \* \* \* \*